United States Patent
Smith et al.

(10) Patent No.: US 8,765,598 B2
(45) Date of Patent: Jul. 1, 2014

(54) CONDUCTIVE STRUCTURES, SYSTEMS AND DEVICES INCLUDING CONDUCTIVE STRUCTURES AND RELATED METHODS

(75) Inventors: Michael A. Smith, Boise, ID (US); Eric H. Freeman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 13/151,945

(22) Filed: Jun. 2, 2011

(65) Prior Publication Data
US 2012/0306090 A1 Dec. 6, 2012

(51) Int. Cl.
H01L 23/485 (2006.01)
H01L 21/28 (2006.01)

(52) U.S. Cl.
USPC ............ 438/637; 438/622; 257/700; 257/773

(58) Field of Classification Search
USPC .................................. 438/622, 637
See application file for complete search history.

(56) References Cited

U.S. PATENT DOCUMENTS

| | | | |
|---|---|---|---|
| 5,707,885 A | 1/1998 | Lim | |
| 6,858,906 B2 | 2/2005 | Lee et al. | |
| 7,253,467 B2 | 8/2007 | Lee et al. | |
| 7,315,474 B2 | 1/2008 | Lue | |
| 7,361,554 B2 | 4/2008 | Park et al. | |
| 7,701,771 B2 | 4/2010 | Jeong et al. | |
| 7,776,683 B2 | 8/2010 | Tran et al. | |
| 7,875,985 B2 | 1/2011 | Hiller et al. | |
| 2006/0180851 A1 | 8/2006 | Lee et al. | |
| 2007/0252201 A1 | 11/2007 | Kito et al. | |
| 2009/0020744 A1* | 1/2009 | Mizukami et al. | 257/4 |
| 2009/0212350 A1 | 8/2009 | Kidoh et al. | |
| 2009/0310415 A1 | 12/2009 | Jin et al. | |
| 2010/0090188 A1 | 4/2010 | Futatsuyama | |
| 2010/0133599 A1 | 6/2010 | Chae et al. | |
| 2010/0224962 A1* | 9/2010 | Kim | 257/536 |
| 2010/0230724 A1 | 9/2010 | Sinha et al. | |
| 2011/0018036 A1 | 1/2011 | Hwang et al. | |

(Continued)

FOREIGN PATENT DOCUMENTS

JP 59182570 A 10/1984
JP 2011-060958 A 3/2011

OTHER PUBLICATIONS

Freeman et al., U.S. Appl. No. 13/151,892, entitled Apparatuses Including Stair-Step Structures and Methods of Forming the Same, filed Jun. 2, 2012.

(Continued)

Primary Examiner — Victor A Mandala
Assistant Examiner — William Harriston
(74) Attorney, Agent, or Firm — TraskBritt

(57) ABSTRACT

Conductive structures include a plurality of conductive steps and a contact extending at least partially therethrough in communication with at least one of the plurality of conductive steps and insulated from at least another one of the conductive steps. Devices may include such conductive structures. Systems may include a semiconductor device and a stair step conductive structure having a plurality of contacts extending through a step of the stair step conductive structure. Methods of forming conductive structures include forming contacts in contact holes formed through at least one conductive step of a conductive structure. Methods of forming electrical connections in stair step conductive structures include forming contacts in contact holes formed through each step of the stair step conductive structure.

27 Claims, 8 Drawing Sheets

(56) References Cited

U.S. PATENT DOCUMENTS

| | | | |
|---|---|---|---|
| 2011/0031630 A1* | 2/2011 | Hashimoto | 257/774 |
| 2011/0065272 A1 | 3/2011 | Mizukami et al. | |
| 2012/0261722 A1* | 10/2012 | Tang et al. | 257/202 |
| 2012/0306089 A1 | 12/2012 | Freeman et al. | |

OTHER PUBLICATIONS

PCT International Search Report, Application No. PCT/US2012/039042, mailed Dec. 26, 2012, three (3) pages.

PCT Written Opinion of the International Searching Authority, Application No. PCT/US2012/039042, mailed Dec. 26, 2012, eight (8) pages.

Tanaka, et al., "Bit Cost Scalable Technology with Punch and Plug Process for Ultra High Density Flash Memory," Symposium on VLSI Technology Digest of Technical Papers, pp. 14-15 (2007).

Fukuzumi, et al., "Optimal Integration and Characteristics of Vertical Array Devices for Ultra High Density, Bit Cost Scalable Flash Memory," IEDM Technical Digest, pp. 449-452 (2007).

Endoh, et al., "Novel Ultrahigh Density Flash Memory with a Stacked Surrounding Gate Transistor (S-SGT) Structured Cell," IEEE Transactions on Electron Devices, vol. 50, No. 4, pp. 945-951 (Apr. 2003).

Taylor, Colleen, Toshiba Touts 3D NAND Cell Array as Ticket to Higher Density NAND, EDN, Jun. 12, 2007, http://www.edn.com/article/462070-toshiba_touts_3D_NAND_cell, 2 pages.

* cited by examiner

CONDUCTIVE STRUCTURES, SYSTEMS AND DEVICES INCLUDING CONDUCTIVE STRUCTURES AND RELATED METHODS

TECHNICAL FIELD

Embodiments of the present disclosure relate to conductive structures having contacts extending through at least a portion of the conductive structure, to devices including such conductive structures, to systems including such devices, to methods of forming such conductive structures and to methods of forming electrical connections for a stair step conductive structure.

BACKGROUND

Memory devices are typically provided as internal, semiconductor, integrated circuits in computers or other electronic devices. There are many different types of memory devices including random-access memory (RAM), read-only memory (ROM), synchronous dynamic random-access memory (SDRAM), dynamic random-access memory (DRAM), and non-volatile memory. As the performance and complexity of electronic systems increase, the requirement for additional memory in memory systems also increases. The trend in the semiconductor industry is toward smaller memory devices that may be used to fabricate high density circuits on a single chip. Miniaturization of transistor devices and circuits may be achieved by reducing the size of all the features of devices so that the resultant devices occupy a smaller surface area of a wafer.

To reduce costs of fabricating such high density memory arrays, the parts count must be kept to a minimum. This means being able to achieve a higher density of memory on a single chip instead of by stacking separate memory chips. However, as memory devices decrease in size while increasing the number of memory cells in a memory array, the number of connections necessary to operate each memory device also increases.

For example, in non-volatile memory (e.g., NAND flash memory), one way to increase memory density is by using a vertical memory array, which is also referred to as a three-dimensional (3-D) array. Such vertical memory arrays are disclosed in, for example, U.S. Patent Application Publication No. 2007/0252201 to Kito et al. Conventional vertical memory arrays require electrical connection between the conductive plates and access lines (e.g., word lines) so that memory cells in the array may be uniquely selected for writing or reading functions. One type of vertical memory array includes semiconductor pillars that extend through holes in layered conductive plates (also referred to as word line plates or control gate plates), with dielectric materials at each junction of the pillars and the conductive plates. Thus, multiple transistors can be formed along each pillar. This structure enables a greater number of transistors to be located in a unit of die area by building the array upwards (vertically) on a die. However, in such a device each memory cell must include multiple conductive connections (e.g., word lines, bit lines, selection gates, etc.) in order to read, write, and erase each individual memory cell or plurality of memory cells. In such a memory array having a high density of memory cells, it may be difficult to provide the connections to each memory cell in an effective and efficient manner.

DETAILED DESCRIPTION

Figure 1:
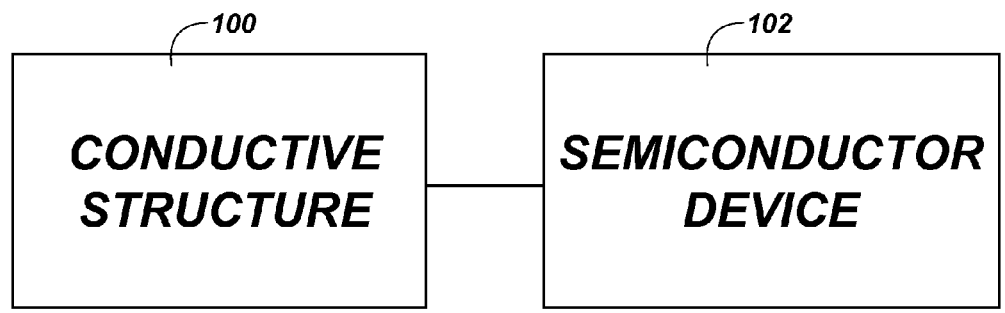
FIG. 1 is a schematic block diagram of an embodiment of an electric system including a conductive structure and a semiconductor device in accordance with an embodiment of the present disclosure.

As used herein, any relational term, such as "first," "second," "over," "under," "on," "underlying," "overlying," etc. is used for clarity and convenience in understanding the disclosure and drawings and does not connote or depend on any specific preference, orientation, or order.

As used herein, the terms "distal" and "proximal" describe positions of elements of conductive structures in relation to a substrate upon which the conductive structures are formed. For example, the term "distal" refers to a position relatively more distant from the substrate, and the term "proximal" refers to a position in closer relative proximity to the substrate.

As used herein, the terms "lateral" and "longitudinal" describe directions of elements of the conductive structures in relation to a substrate upon which the conductive structures are formed and in relation to how the conductive structures are depicted in the figures. For example, the term "lateral" refers to a direction perpendicular to an axis ending from a proximal end to a distal end of the conductive structures (e.g., a direction extending across (i.e., side to side) the figures). The term "longitudinal" refers to a direction extending parallel to an axis ending from a proximal end to a distal end of the conductive structures (e.g., a direction extending up and down along the figures).

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below may not form a complete process flow for manufacturing a semiconductor device. The structures described below do not form a complete semiconductor device. Only those process acts and structures necessary to understand the embodiments of the present disclosure are described in detail below. Additional acts to form complete conductive structures and semiconductor devices may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure. The illustrations presented herein are not meant to be actual views of any particular system, device, structure, or memory cell, but are merely idealized representations which are employed to describe the embodiments of the present disclosure. The drawings presented herein are not necessarily drawn to scale. Additionally, elements common between drawings may retain the same numerical designation.

FIG. 1 is a schematic block diagram of an electronic system such as, for example, a non-volatile memory device (e.g., a vertical memory device such as a three-dimensional NAND memory device) including one or more conductive structures 100 and one or more semiconductor devices 102 (e.g., a plurality of memory cells, a CMOS device, etc.). For example, the electronic system may include one or more conductive structures 100 directly or indirectly connected to and in communication with (e.g., in electrical communication with, in direct or indirect contact with) one or more semiconductor devices 102. It is noted that while conductive structures described herein may make specific reference to use with a NAND device, the disclosure is not so limited and may be applied to other semiconductor and memory devices.

The electronic system shown in FIG. 1 may comprise, for example, a computer or computer hardware component, a server or other networking hardware component, a cellular telephone, a digital camera, a personal digital assistant (PDA), portable media (e.g., music) player, etc. The electronic system further may include at least one electronic signal processor device (often referred to as a "microprocessor"). The electronic system may, optionally, further include one or more input devices for inputting information into the electronic system by a user, such as, for example, a mouse or other pointing device, a keyboard, a touchpad, a button, or a control panel and one or more output devices for outputting information (e.g., visual or audio output) to a user such as, for example, a monitor, display, printer, speaker, etc.

Figure 2:
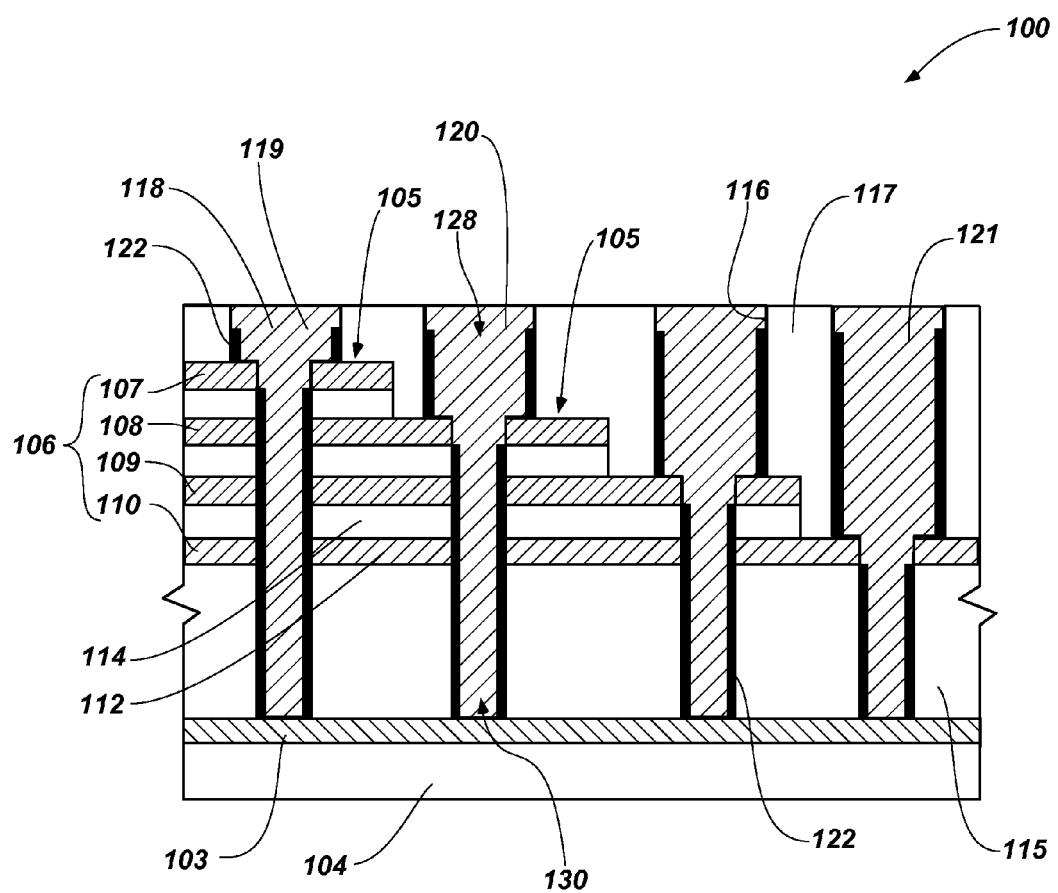
FIG. 2 is a simplified cross-sectional side view of a portion of a conductive structure in accordance with an embodiment of the present disclosure.

FIG. 2 is a simplified illustration of a conductive structure 100 that may be used in conjunction with a semiconductor device 102 (FIG. 1) that may include a conductive material (e.g., an interconnect 103) on a substrate 104. The interconnect 103 may be formed from a material such as, for example, a metal (e.g., W, Ni, tantalum nitride (TaN), Pt, tungsten nitride (WN), Au, titanium nitride (TiN), or titanium aluminum nitride (TiAlN)), polysilicon, other conductive materials, or combinations thereof. In some embodiments, the substrate 104 may include any structure that includes a semiconductor type material including, for example, silicon, germanium, gallium arsenide, indium phosphide, and other III-V or II-VI type semiconductor materials. Substrates 104 may include, for example, not only conventional substrates but also other bulk semiconductor substrates such as, by way of example and not limitation, silicon-on-insulator (SOI) type substrates, silicon-on-sapphire (SOS) type substrates, and epitaxial layers of silicon supported by another material. Furthermore, when reference is made to a "substrate" in the following description, previous process steps may have been utilized to at least partially form elements or components of a circuit or device in or over a surface of the substrate. In some embodiments, the substrate 104 may include any structure that the conductive structure 100 may be formed over (e.g., on) including, for example, other portions of an electronic system or semiconductor device 102 (FIG. 1).

One or more portions of the conductive structure 100 may be formed as a so-called "stair step" structure including a plurality of steps 106 (e.g., steps 107, 108, 109, 110), each step 107, 108, 109, 110 being formed at least from a conductive material 112 (e.g., polysilicon). For example, the conductive materials 112 may form a stair step structure over the interconnect 103 and the substrate 104. Each conductive step 107, 108, 109, 110 may be insulated from (e.g., electrically insulated, separated, or isolated from) one or more adjacent steps 106 by insulative material 114 (e.g., an electrically insulative material such as a dielectric material). In some embodiments, one or more steps 106 may be formed by more than one conductive material 112 where each of the conductive steps 106 are at least partially insulated from one another with one or more insulative materials 114. The conductive material 112 of the step most proximal to the interconnect 103 and the substrate 104 (e.g., step 110) may be separated from the interconnect 103 by an insulative material 115. An insulative material 117 may also be disposed on a distal portion of each of the steps 106. By way of example and not limitation, insulative materials (e.g., insulative materials 114, 115, 117) discussed herein may include any suitable at least partially electrically insulating materials such as an oxide material (e.g., $SiO_2$, $Al_2O_3$, etc.), a nitride material (e.g., $Si_3N_4$, MN, etc.), or a combination of oxide and nitride materials such as, for example, an oxynitride material, a re-oxidized oxynitride material, or a so-called "oxide-nitride-oxide" (ONO) structure. In some embodiments, the insulative material 114, 115, 117, may each comprise similar materials, dissimilar materials, or combinations thereof.

In some embodiments, the conductive material 112 of each of the steps 106 may form a conductive plate (e.g., a word line plate) for supplying electrical signals to a semiconductor device 102 (FIG. 1) such as, for example, a plurality of memory cells.

Each of the steps 106 of the stair step structure may include a contact portion 105 to facilitate forming one or more connections (e.g., electrical connections) with each of the individual steps 106 as discussed in further detail below. In some embodiments, each step 106 may include a contact portion 105 that is laterally offset from one or more adjacent steps 106. For example, step 108 includes a contact portion 105 (e.g., a lateral end portion of conductive material 112) extending laterally beyond an adjacent step (e.g., step 107). In other words, step 108 does not laterally extend the same distance as step 107.

Referring still to FIG. 2, an opening such as, for example, a contact hole 116 (e.g., a via) may extend through each of the steps 106 at the contact portion 105 of the steps 106 to enable each of the steps 106 to be individually contacted in order to provide a connection to each of the steps 106. For example, each of the steps 106 may include a contact 118 formed in the contact hole 116 extending therethrough. The contact 118 may extend through the conductive materials 112 of each of the steps 106. The contact 118 may be formed from a conductive material such as, for example, a metal (e.g., W, Ni, tantalum nitride (TaN), Pt, tungsten nitride (WN), Au, titanium nitride (TiN), or titanium aluminum nitride (TiAlN)), polysilicon, or other conductive materials. In some embodiments, the contact 118 may include one or more conductive materials foamed therein. For example, as discussed below in greater detail, the contact 118 may include an outer portion formed from a different material (e.g., a liner 132 (FIG. 7) such as a conductive liner formed from a metal nitride) to facilitate electrical contact between an inner portion of the contact 118 (e.g., formed from pure tungsten) and the conductive material 112 of each of the steps 106. In some embodiments, a distal portion 128 of the contact hole 116 may be formed to have a lateral width (e.g., diameter) that is relatively greater than a width of a proximal portion 130 of the contact hole 116. Such embodiments may enable the contact 118 to contact (and be in communication with) both a lateral side surface of the conductive material 112 of a step 106 (e.g., a surface extending along the contact hole 116) and a distal surface of the conductive material 112 of the step 106.

The contact 118 may enable a respective one of the steps 106 to be in communication with the interconnect 103 (e.g., a conductive interconnect in communication with a CMOS device such a word line driver). The contact hole 116 and contact 118 formed therein may extend through a first step 107 and each step 108, 109, 110 underlying (e.g., positioned below in a direction extending toward the substrate 104). Stated in another way, the contact hole 116 and contact 118 formed therein may extend through one or more steps 106 in a direction extending from a distal portion of the conductive structure 100 to a proximal portion of the conductive structure 100. For example, the contact hole 116 and contact 118 formed therein may extend through step 107 and each step that step 107 is formed over (e.g., steps 108, 109, 110).

The contact holes 116 and contacts 118 may be positioned such that each contact hole 116 and contact 118 extends through a differing distal portion (e.g., contact portion 105) of the steps 106 forming the stair step structure. For example, contact 119 formed in a contact hole 116 may be positioned such that the contact 119 extends through a distal portion of step 107 (e.g., the conductive material 112 of step 107). Contact 120 may be positioned to extend through a distal portion of step 108 (e.g., the conductive material 112 of step 108) while not extending through the distal portion of step 107. In other words, each contact 118 may be positioned such that the contact (e.g., contact 119) extends through a conductive material 112 of a step (e.g., step 107) that is positioned more distal from (i.e., a greater distance from) the interconnect 103 than a conductive material 112 of an adjacent step (e.g., step 108).

As further shown in FIG. 2, one or more steps 106 may be at least partially insulated from the contact 118 extending through the conductive steps 106 while one or more other conductive steps 106 may be in connection with the contact 118. For example, each step 108, 109, and 110 underlying step 107 may be isolated from electrical communication with the contact 118 in the contact hole 116 by a liner 122 comprising an insulative material extending along a portion of the conductive structure forming the contact hole 116, while step 107 is in contact with the contact 118. Stated in another way, the liner 122 is formed between the contact 118 and the conductive materials 112 of steps 108, 109, and 110, such that the conductive materials 112 of steps 108, 109, and 110 are insulated from the contact 118. However, the liner 122 is formed such that at least a portion of the contact 118 and the conductive material 112 of step 107 are in communication (e.g., in contact to enable electrical signals to pass between the contact 118 and the conductive material 112 of step 107). Each contact 118 may be in electrical communication with a respective at least one of the steps 106. For example, contact 119 may be in electrical communication with conductive step 107, contact 120 may be in electrical communication with conductive step 108, etc. In some embodiments, the liner 122 may be formed from an insulative material such as those listed above.

In some embodiments and as shown in FIG. 2, the conductive structure 100 may have a stair step structure that enables the contacts 118 (e.g., contacts 119, 120, 121) to be formed as columns. One or more of the contacts 118 may extend through a different number of steps 106 and be in communication with a selected (e.g., particular) one of the steps 106. For example, the contacts 118 may each be in contact with the most distal of the steps 106 that the contact 118 extends through (e.g., the step 106 furthest from the interconnect 103). As shown in FIG. 2, a contact 119 may form a first column through the stair step structure of the conductive structure 100 and may be in communication with step 107 while being isolated from the steps 108, 109, and 110 by the liner 122. Similarly, a contact 120 may form a second column through the stair step structure of the conductive structure 100 and may be in communication with step 108 while being isolated from steps 109 and 110 by the liner 122, and so on. This or a similar pattern may continue in a similar manner until a contact 121 is in communication the most proximal of the steps 106 (e.g., step 110). It is noted that while the embodiment of FIG. 2 illustrates four steps 106, for the purposes of describing embodiments of the instant disclosure, conductive structures 100 may be formed with any number of steps including any number of conductive materials and insulative materials. It is further noted that while the embodiment of FIG. 2 illustrates each of the steps 106 having one conductive material 112 separated by an insulative material 114, in other embodiments, the steps 106 may include one or more conductive materials (e.g., one or more conductive materials, each separated by insulative material). It is also noted that while the embodiment of FIG. 2 illustrates a conductive material 112 formed over (e.g., on) insulative material 114, in other embodiments, the order of the conductive material 112 and the insulative material 114 may be reversed. Further, in yet other embodiments, contacts extending through the steps may be in communication with or isolation from any number of conductive materials in each step or in the overall conductive structure.

In some embodiments, the liner 122 may be formed to enable an interface between the conductive material 112 of the steps 106 and the contact 118 on a lateral surface (e.g., a side surface) of the conductive material 112 and a distal surface of the conductive material. Such a configuration may be utilized to enhance the connection between the conductive material 112 of the steps 106 and the contact 118.

Referring still to FIG. 2, the liner 122 may be formed to insulate one or more of the conductive steps 106 while enabling communication with one or more of the remaining conductive steps 106 while also enabling communication with the interconnect 103 formed at a proximal end of the contacts 118. In some embodiments, elements of the conductive structure 100 (e.g., the contact holes 116, the contacts 118, the liner 122, etc.) may be formed to enable communication with other semiconductor elements through a distal end of the contacts 118.

It is noted that embodiments of the present disclosure are shown in the drawings as having contact holes and contacts as being positioned substantially in the same cross-sectional plane for convenience and clarity. It is contemplated that the contact holes and contacts may be formed in the same cross-sectional planes, differing cross-sectional planes, or combinations thereof.

Various methods for forming conductive structures according to embodiments of the present disclosure, such as the conductive structure shown in FIG. 2, are described below. To facilitate description, the methods are described, in some instances, with reference to a portion of the conductive structures (e.g., illustrating one contact hole and a contact disposed therein extending through a portion of conductive materials that form, for example, a portion a stair step structure). In practice, however, a plurality of contact holes and contacts may be formed substantially simultaneously in one or more conductive structures.

In each of the embodiments discussed below, the materials forming the conductive structures may be formed by, for example, growing, diffusing, depositing, or otherwise providing thereon. The various materials may be formed using, for example, deposition techniques (e.g., chemical vapor deposition (CVD), physical vapor deposition (PVD), atomic layer deposition (ALD), sputtering, thermal evaporation, or plating), oxidation processes (e.g., thermal oxidation, ISSG oxidation), and patterning techniques (e.g., masking and etching) known in the art of integrated circuit fabrication. The insulative materials may be formed by chemical vapor deposition, by decomposing tetraethyl orthosilicate (TEOS), or by any other process known in the art of integrated circuit fabrication.

Additionally, the materials or portions thereof may be removed using, for example, an abrasion or polishing process (e.g., a chemical-mechanical planarization (CMP) process, a chemical polishing process, a mechanical planarization process), an etching process, a lift-off process, or a combination thereof. Etching processes may include, for example, wet or dry etching such as removing portions of a material using a mask and an anisotropic etching process (e.g., a reactive ion etching process, such as using a plasma) or removing portions of a material using a mask and an isotropic process (e.g., a chemical etching process). It is noted that the particular composition of the gases used to generate the reactive ions, the particular composition of the chemical etchant, and the operating parameters of the etching process may be selected based on the composition of the mask, the material to be etched, and the surrounding materials.

Figure 3:
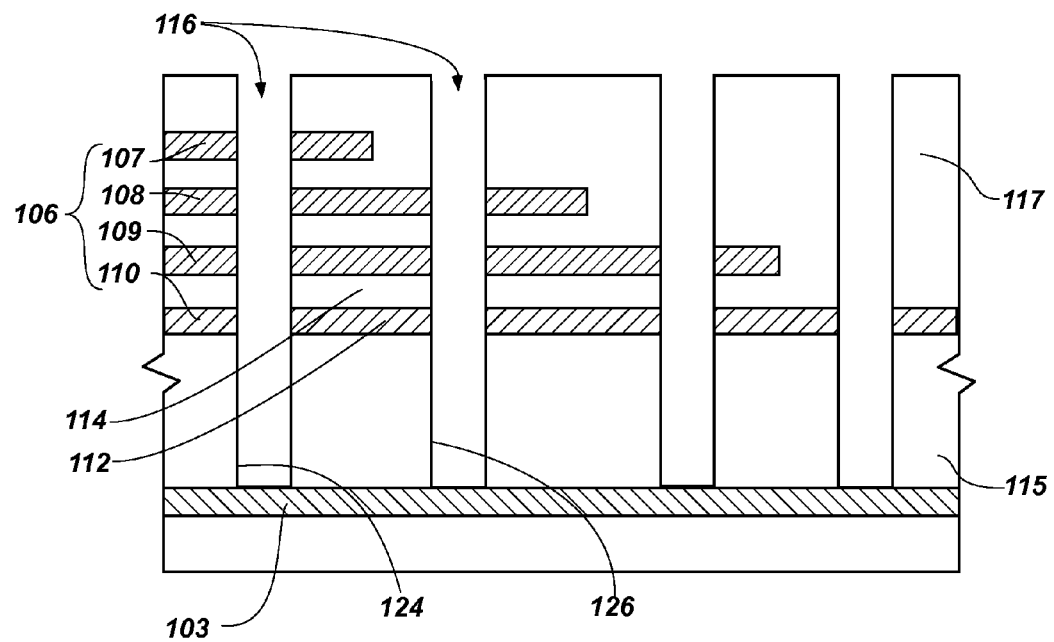
FIGS. 3 through 11 are cross-sectional side views of a portion of a workpiece and illustrate embodiments of methods of the present disclosure that may be used to form a conductive structure like that shown in FIG. 2.

Embodiments of methods that may be used to form, for example, the conductive structure 100 shown in FIG. 2 are described with reference to FIGS. 3 through 12. Referring to FIG. 3, the conductive structure 100 (FIG. 2) may be formed, for example, as a stair step structure by forming a plurality of steps 106 (e.g., steps 107, 108, 109, 110) including conductive materials 112 at least partially separated by insulative materials 114, removing a portion of the conductive materials 112 and insulative materials 114 to form the steps 106, forming an insulative material (e.g., insulative material 117) over the steps 106, and planarizing the structure, such as through an abrasion process. Such methods of forming a stair step structure are described, for example, in U.S. patent application Ser. No. 13/151,892, filed on even date herewith, for APPARATUSES INCLUDING STAIR-STEP STRUCTURES AND METHODS OF FORMING THE SAME.

One or more contact holes 116 may be formed (e.g., through an etching process such as an anisotropic etch) in a workpiece (e.g., stair step structure) extending through the insulative materials (e.g., insulative materials 114, 115, 117) and through one or more conductive steps 106. The contact holes 116 may extend substantially to the interconnect 103. As shown in FIG. 3, the contact holes 116 may be positioned such that each contact hole 116 extends through a distal portion of each step 106 (e.g., the contact portion 105 (FIG. 2). In other words, the contact holes 116 extend from a distal portion of the conductive structure 100 (e.g., a surface of insulative material 117) to a proximal portion (e.g., the interconnect 103) of the conductive structure 100. Each contact hole 116 may be positioned to first extend through, in a direction from a distal portion to a proximal portion of the conductive structure 100, a differing step 106. For example, a first contact hole 116 (e.g., contact hole 124) first extends, in a direction from a distal portion to a proximal portion of the conductive structure 100, through step 107. A second contact hole 116 (e.g., contact hole 126) first extends, in a direction from a distal portion to a proximal portion of the conductive structure 100, through step 108 and so on.

Figure 4:
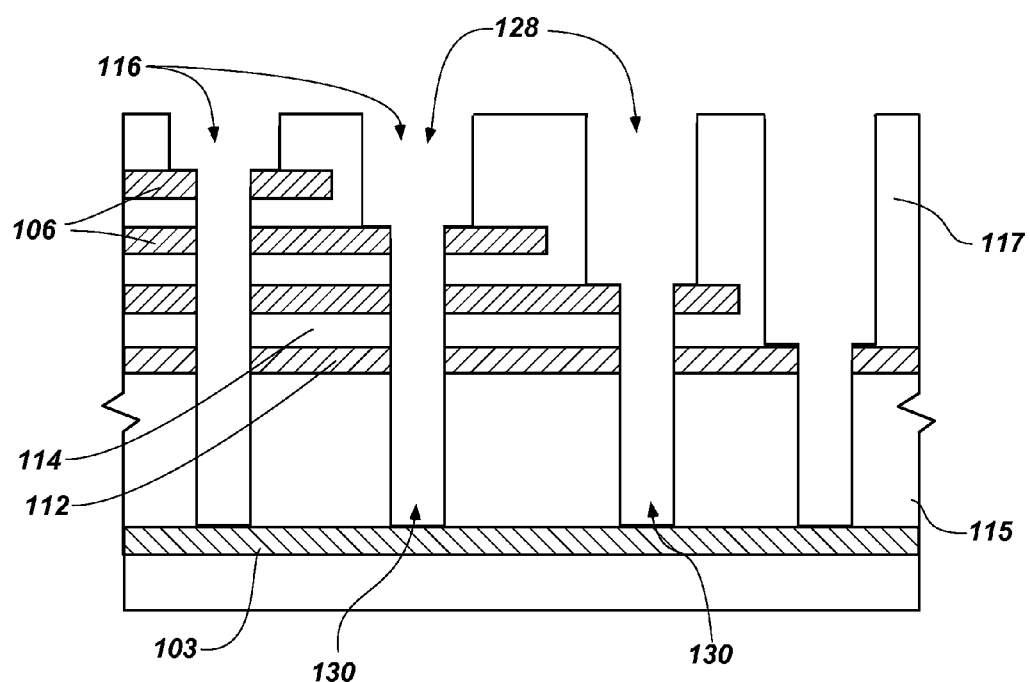

As shown in FIG. 4, a distal portion 128 of the contact holes 116 may be formed to have a width (e.g., diameter) greater than a width of a proximal portion 130 of the contact holes 116. For example, the insulative material 114, 117 may be etched to form the wider distal portion 128 of the contact holes 116 extending from the most distal conductive material 112 of each of the steps 106 to a distal end of the insulative material 117. The wider distal portions 128 of the contact holes 116 may be formed by etching (e.g., an isometric etch including an etchant with selectivity to the insulative materials 114, 117). In other words, the chemistry of the etchant may be configured to remove the insulative materials 114, 117 at a faster rate as compared to the removal rate of other materials.

Figure 5:
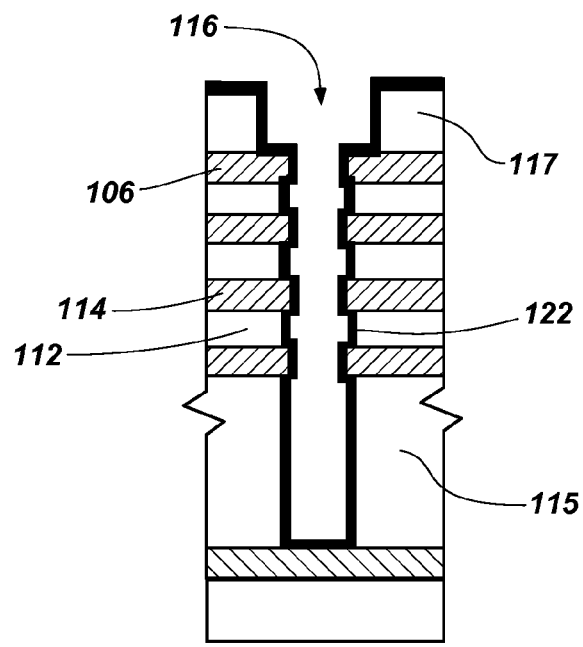

FIGS. 5 through 11 illustrate a single contact hole 116 and contact 118 of a portion of the workpiece shown in FIGS. 3 and 4. It is noted that, as discussed above, one or more contact holes may be processed in a similar manner either substantially simultaneously with the contact hole 116 shown in FIG. 5 or in separate processes. As shown in FIG. 5, in some embodiments, the etching (e.g., isometric etching) of the insulative material 114, 115, 117 may also form recesses in the insulative material 114 extending between the steps 106 and in the insulative materials 115, 117. If present, the recesses may increase portions of the width of the contact hole 116. In other embodiments, forming the contact holes 116 in the insulative materials 114, 115, 117 may not substantially form recesses in the insulative material 114 extending between the conductive steps 106 or in the insulative materials 115, 117 such as the contact holes shown in FIGS. 12 through 16.

As further shown in FIG. 5, the liner 122 may be formed in contact hole 116. As formed, the liner 112 may at least substantially cover the conductive material 112 of each of the steps 106 exposed in the contact hole 116. The liner 122 may be formed (e.g., conformally deposited) in the contact hole 116 such that a portion of the contact hole 116 remains unfilled.

Figure 6:
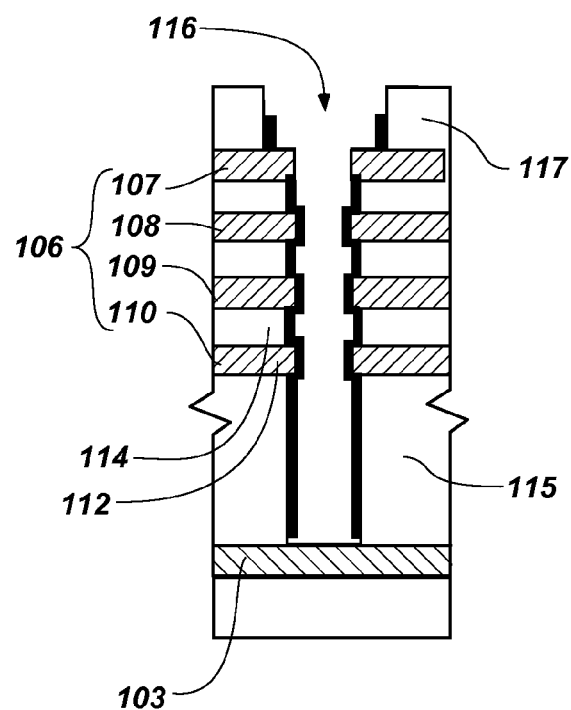

As shown in FIG. 6, a portion of the liner 122 may be removed to expose one or more of the conductive steps 106. Another portion of the liner 122 may be removed to expose the interconnect 103. Portions of the liner 112 may be removed using one or more etching processes such as, for example, one of more anisotropic etching processes. Stated in another way, an etchant with selectivity to the insulative material forming the liner 122 may be applied to the workpiece in an anisotropic etching process that removes horizontal surfaces (e.g., surfaces of the liner 122 extending in a lateral direction) faster than vertical surfaces (e.g., surfaces extending in a longitudinal direction). The same etching process or a different etching process may also remove vertical portions of the liner 122 overlying the most distal of the steps 106 (e.g., step 107). As shown in FIG. 6, such a process may expose the lateral and longitudinal surfaces of the conductive material 112 of the most distal of the steps 106 (e.g., step 107) while the conductive materials 112 of steps 108, 109, and 110 may remain substantially covered with the liner 122. It is noted that materials selected for the liner 122 and the insulative material 114, 115, 117 (e.g., an oxide, a nitride, or combinations thereof) may affect the structure of the liner 122 after portions of the liner 112 have been removed. For example, if the liner 122 and the insulative material 117 are formed from the same material (e.g., an oxide), the distal portion of the liner 122 may not recess in the manner shown in FIG. 6. Nonetheless, any suitable materials and removal process may be utilized to at least partially expose a portion of one or more selected conductive steps 106 in order to make a connection between the contact 118 and the one or more selected conductive steps 106.

Figure 7:
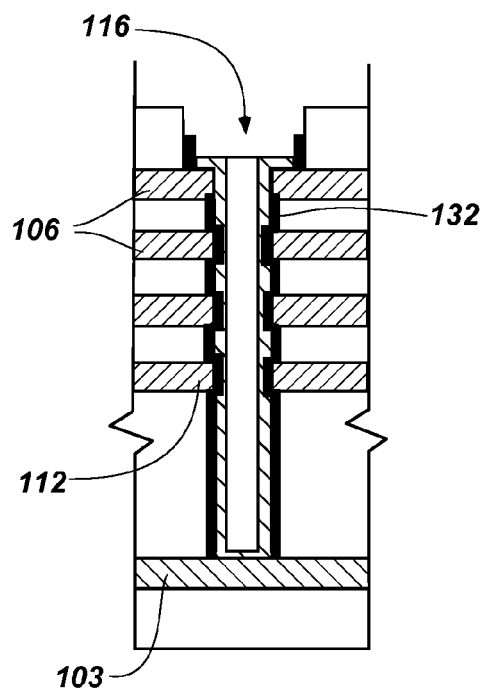
Figure 8:
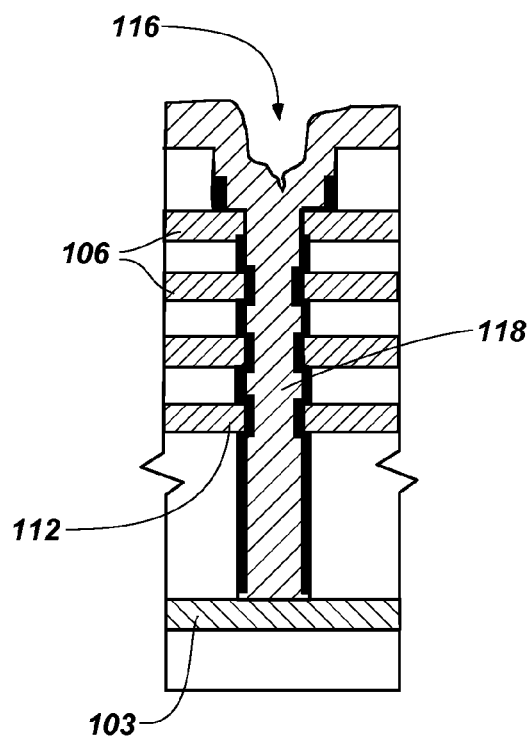

As shown in FIG. 7, a conductive liner 132 may be formed in the contact hole 116 to enable communication between one or more selected conductive steps 106, the interconnect 103, and a contact 118 (FIG. 8) that is formed in the contact hole 116. For example, the conductive liner 132 (or processes utilized to prepare the workpiece for the conductive liner 132) may act to clean surfaces of the conductive materials 112 and the interconnect 103 in order to enable communication between the conductive materials 112, the interconnect 103, and the contact 118 (FIG. 8). In some embodiments, the conductive liner 132 may comprise a conductive material and may be in communication with the conductive materials 112 and the interconnect 103. In such an embodiment, the contact 118 (FIG. 8) may be in communication with the conductive materials 112 and the interconnect 103 via the conductive liner 132.

FIG. 8 illustrates forming a conductive material in the contact hole 116 in accordance with an embodiment of the present disclosure. The conductive material may be conformally deposited. As shown in FIG. 8, in some embodiments, the conductive material may substantially fill the contact hole 116, forming the contact 118. In some embodiments where the conductive material is conformally deposited, a distal portion 128 of the contact hole 116 may be sized to have a width (e.g., diameter) that enables the conductive material of the contact 118 to pinch-off within a proximal portion 130 of the contact hole 116. Stated in another way, the distal portion 128 of the contact hole 116 may be sized to have a width that enables the substantial closing off of the contact hole 116 with the conductive material of the contact 118 at the proximal potion 130 of the contact hole 116. For example, the distal portion 128 of the contact hole 116 may be sized to have a width sufficient to enable pinching-off of the contact 118 in the proximal portion 130 of the contact hole 116 but not in the distal portion 128 of the contact hole 116. It is noted that the width of the distal portion 128 of the contact hole 116 enabling the material to pinch-off therein will vary based at least partially on the material used to fill the contact hole 116 and the technique used to deposit the material. The conductive material may also extend over the insulative material 117. The conductive material forming the contact 118 may be deposited such that the contact 118 is in communication with one or more of the conductive steps 106 and the interconnect 103. As discussed above, in some embodiments, both the conductive material deposited in the act shown in FIG. 8 and the liner 132 (FIG. 7) may form the contact 118.

Figure 9:
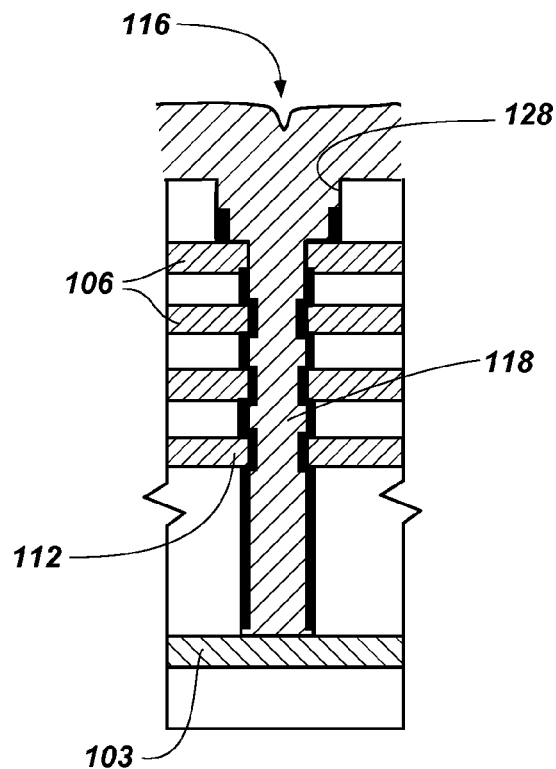

FIG. 9 illustrates forming a conductive material in the contact hole 116 in accordance with another embodiment of the present disclosure. The conductive material may also extend over the insulative material 117. As shown in FIG. 9, in some embodiments, a distal portion 128 of the contact hole 116 may be sized to have a width (e.g., diameter) that enables conductive material deposited in the contact hole 116 to form the contact 118 to pinch-off within the distal portion 128 of the contact hole 116. Stated in another way, the distal portion 128 of the contact hole 116 may be sized to have a width that enables the substantial closing off of the contact hole 116 with the conductive material of the contact 118 at the distal potion 128 of the contact hole 116. For example, the distal portion 128 of the contact hole 116 may be sized to have a width sufficient to enable pinching-off of the contact 118 in the distal portion 128 of the contact hole 116 rather than a width where the conductive material of the contact 118 will at least partially not pinch-off in the distal portion 128 of the contact hole 116 (see, e.g., FIG. 8). It is noted that the width of the distal portion 128 of the contact hole 116 enabling the material to pinch-off therein will vary based at least partially on the material used to fill the contact hole 116 and the technique used to deposit the material.

Figure 10:
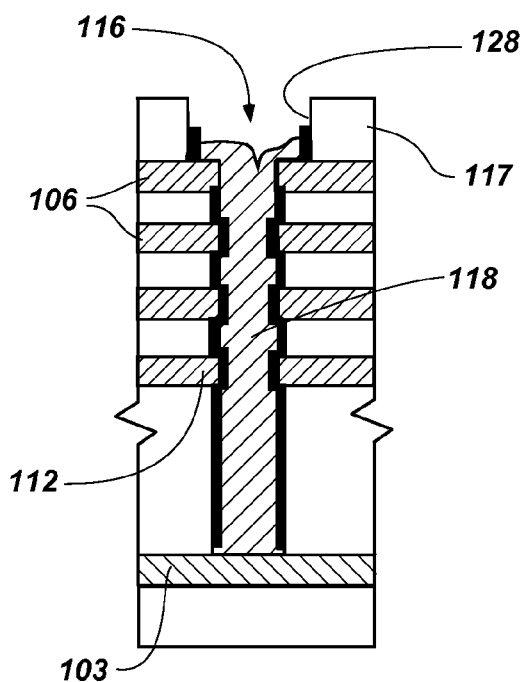
Figure 11:
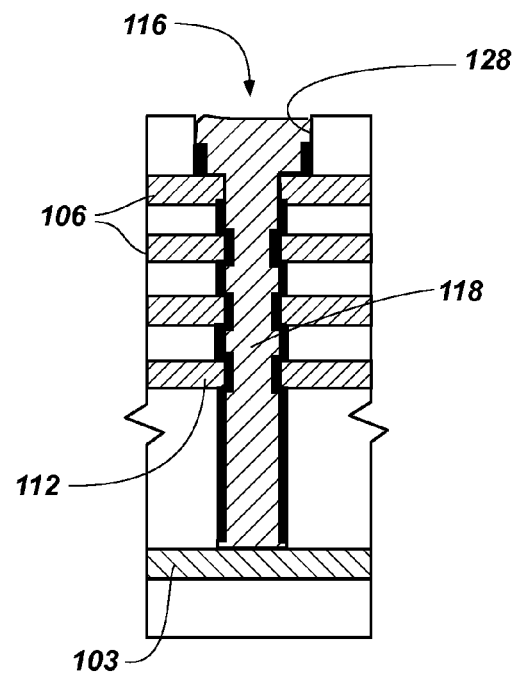

FIGS. 10 and 11 illustrate partially removing material of the workpiece (e.g., the conductive material of the contact 118 overlying the insulative material 117 and portions of the conductive material in the contact hole 116) in accordance with embodiments of the present disclosure such as, for example, by etching as shown in FIG. 10 and by an abrasion process as shown in FIG. 11. Referring to FIG. 10, in some embodiments, material of the contact 118 may be removed using an etching process such as, for example, an isotropic dry etch. The material of the contact 118 may be removed such that a portion of the contact 118 is in communication with one or more conductive steps 106. The etching process may remove the material of the contact 118 overlying the insulative material 117 and a portion of the material within the distal portion 128. For example, as shown in FIG. 10, the material of the contact 118 may be etched such that the contact 118 does not extend past a distal end of the insulative material 117. In some embodiments, the material of the contact 118 may be at least partially recessed with the distal portion 128 of the contact hole 116.

Referring to FIG. 11, in some embodiments, material of the contact 118 may be removed using an abrasion process such as, for example, a polishing process (e.g., a chemical-mechanical planarization (CMP) process). The material of the contact 118 may be removed such that a portion of the contact 118 is in communication with one or more conductive steps 106. For example, as shown in FIG. 11, the material of the contact 118 may be etched such that the contact 118 does not extend past a distal end of the insulative material 117. In some embodiments, the material of the contact 118 may be substantially planar with the distal portion 128 of the contact hole 116 (e.g., substantially planar with a distal end of the insulative material 117). It is noted that the embodiments described above with reference to FIGS. 10 and 11 may also include removing at least a portion of other materials of the workpiece such as, for example, a portion of the insulative material 117.

Figure 12:
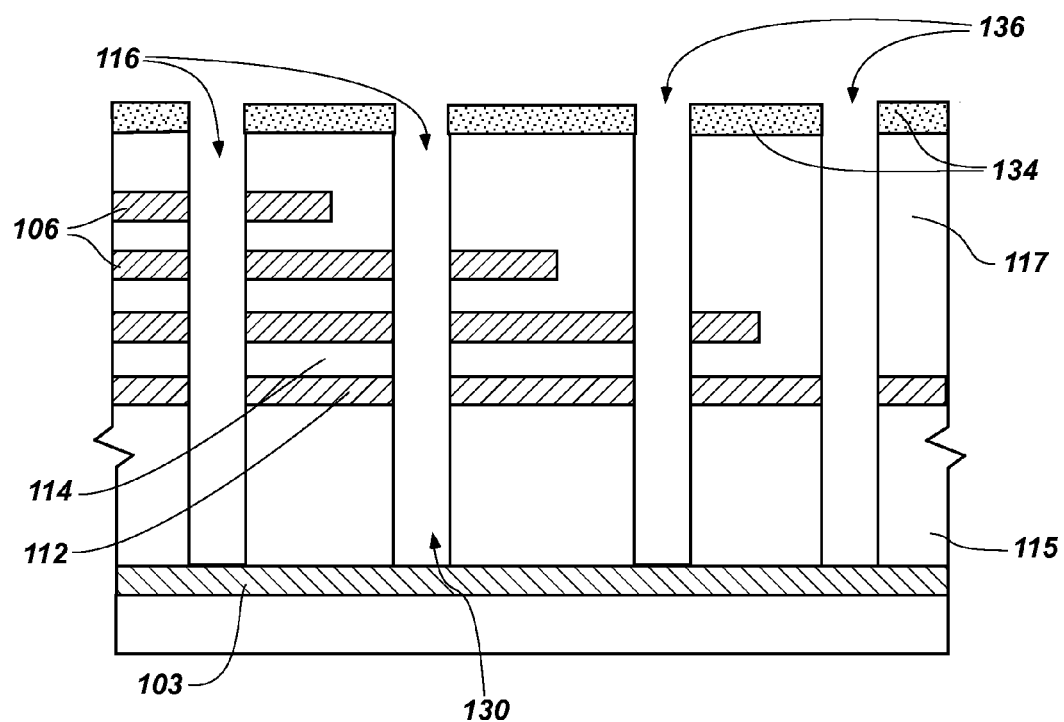
FIGS. 12 through 14 are cross-sectional side views of a portion of a workpiece and illustrate another embodiment of a method of the present disclosure that may be used to form a conductive structure like that shown in FIG. 2.

Another embodiment of a method that may be used to form, for example, the conductive structure 100 shown in FIG. 2 is described with reference to FIGS. 12 through 14. Referring to FIG. 12, one or more contact holes 116 similar to the contact holes 116 shown and described with reference to FIG. 3 may be formed in the workpiece extending through the insulative materials (e.g., insulative materials 114, 115, 117) and through one or more conductive steps 106. The contact holes 116 may extend substantially to the interconnect 103.

As shown in FIG. 12, the contact holes 116 may be formed by forming a mask 134 (e.g., a hard mask (amorphous carbon or transparent carbon), a photoresist, etc.) on a distal end of the workpiece (e.g., the distal end of the insulative material 117) and etching (e.g., an anisotropic etch) a pattern of the mask 134 through the workpiece. For example, one or more openings (e.g., apertures 136) in the mask 134 may define a first width of each of the contact holes 116 (e.g., the width of the proximal portion 130 of the contact holes 116).

Figure 13:
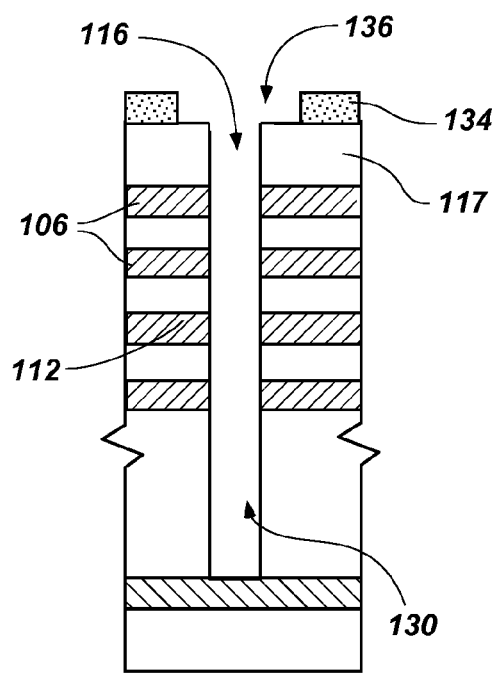
Figure 14:
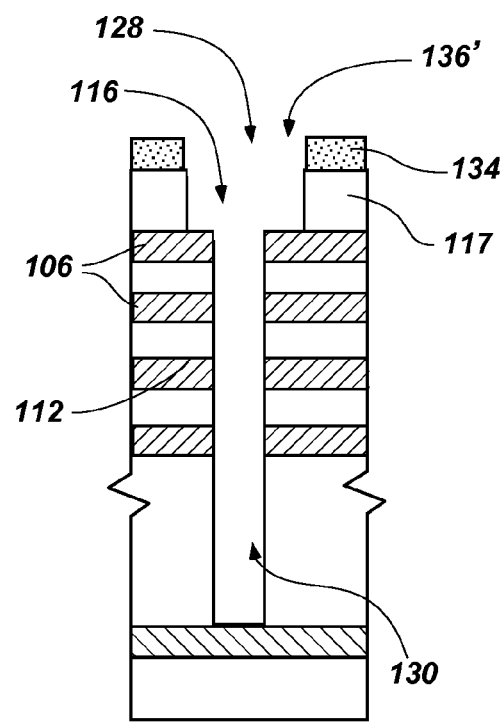

As shown in FIG. 13, a portion of the mask 134 may be removed (e.g., trimmed) to increase the width of the apertures 136 of the mask 134. As shown in FIG. 14, the mask 134 including the relatively wider apertures 136' may be used to etch another portion of the workpiece. For example, the insulative material 117 may be etched (e.g., an anisotropic etch) to form a distal portion 128 of the contact holes 116. As discussed above, the distal portion 128 of the contact holes 116 may be formed to have a width (e.g., diameter) greater than a width of a proximal portion 130 of the contact holes 116. The relatively wider distal portion 128 of the contact hole 116 may extend from a distal end of the workpiece (e.g., a distal end of the insulative material 117) to the distal surface of the conductive step 106 (e.g., the conductive material 112 of the most distal of the steps 106).

The workpiece may be formed into a conductive structure (e.g., conductive structure 100 as shown in FIG. 2) by forming a liner and contacts in the contact holes through processes such as, for example, those described above with reference to FIGS. 5 through 11. In some embodiments, the mask 134 may also be removed from the workpiece. For example, the mask 134 may be removed through an etching or abrasion process such as those described above with reference to FIGS. 11 and 12 (e.g., concurrently with the removal of the material of the contact 118).

Yet another embodiment of a method that may be used to form, for example, the conductive structure 100 shown in FIG. 2 is described with reference to FIGS. 15 and 16. Referring back to FIG. 12, one or more contact holes 116 similar to the contact holes 116 shown and described with reference to FIG. 3 may be formed in the workpiece extending through the insulative materials (e.g., insulative materials 114, 115, 117) and through one or more conductive steps 106. The contact holes 116 may extend substantially to the interconnect 103. A mask 134 (e.g., a hard mask, a photoresist, etc.) may be formed at a distal end of the workpiece (e.g., the distal end of the insulative material 117).

Figure 15:
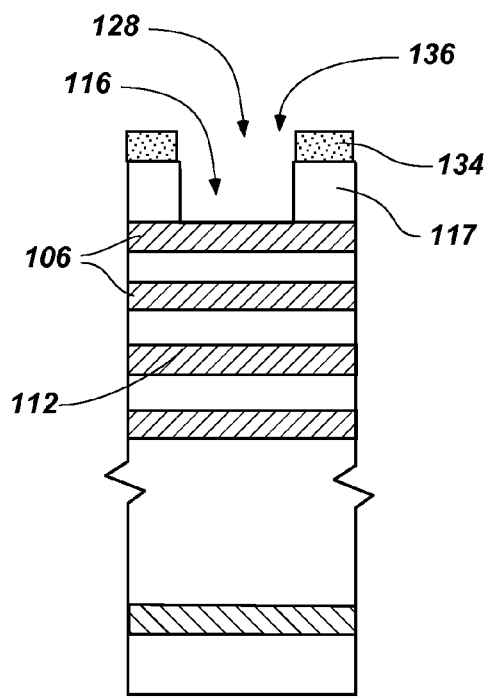
FIGS. 15 and 16 are cross-sectional side views of a portion of a workpiece and illustrate yet another embodiment of a method of the present disclosure that may be used to form a conductive structure like that shown in FIG. 2.

As shown in FIG. 15, one or more apertures 136 in the mask 134 may define a first width of each of the contact holes 116 (e.g., the width of a distal portion 128 of the contact hole 116). The apertures 136 formed by the mask 134 may be used to etch (e.g., an anisotropic etch) the insulative material 117 to form a portion of the contact holes 118 (e.g., a distal portion 128 of the contact holes 118). The distal portion 128 of the contact hole 116 may extend from a distal end of the workpiece (e.g., a distal end of the insulative material 117) to a conductive step 106 (e.g., the conductive material 112 of the most distal of the steps 106).

Figure 16:
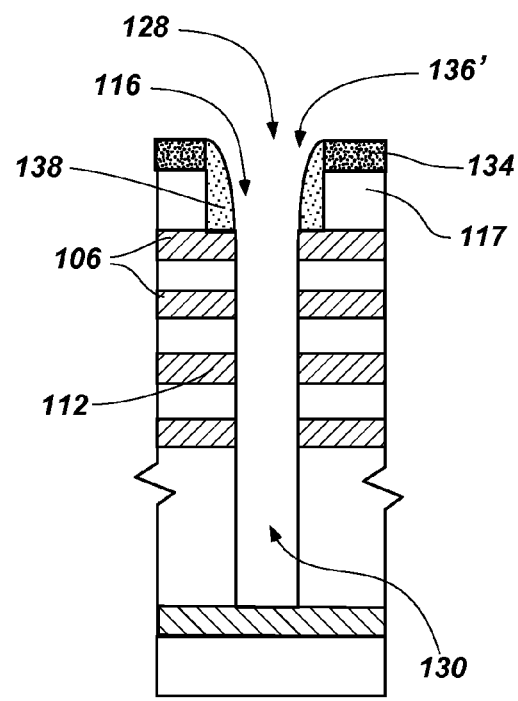

As shown in FIG. 16, a spacer 138 may be formed on vertical sidewalls of the mask 134 and the insulative material 117, at least partially within the distal portion 132 of the contact hole 116. The spacer 138 may reduce (e.g., narrow) the first width of the apertures 136'. The spacer 138 may be formed from a material that is selectively etchable relative to the conductive material 112 and the insulative material 114. The spacer 138 may be used to define a width of each of the contact holes 116 (e.g., the width of a proximal portion 130 of the contact holes 116). An etching process (e.g., anisotropic etch with selectivity to the conductive material 112 and insulative materials 114, 115) through the relative narrower apertures 136' may be used to form the remaining portion of the contact holes 116 (e.g., proximal portion 130 of the contact holes 116) at a width less than the width of the distal portion 128 of the contact hole 116.

The spacer 138 and the mask 134 formed on the distal end of insulative material 117 may be removed (e.g., through an etching process, an abrasion process, or combination thereof).

The workpiece may be formed into a conductive structure (e.g., conductive structure 100 as shown in FIG. 2) by depositing a liner and contacts in the contact holes through processes such as, for example, those described above with reference to FIGS. 5 through 11.

Embodiments of the present disclosure may be particularly useful in forming conductive structures (e.g., a stair step structure) that enable communication with one or more semiconductor devices (e.g., a CMOS device such a word line driver, memory cells, etc.) utilizing contacts extending at least partially through the conductive structure. Such configurations may enable a relatively more direct route of connection through the conductive structure as compared to conventional conductive structures in which contacts extend up from and over the stair step conductive structure. Moreover, such a configuration with contacts extending through the conductive structure may reduce the need for forming tight pitch wiring above the stair step conductive structure by enabling a relatively simplified and shortened route of connection to conductive elements positioned beneath the conductive structure.

CONCLUSION

In an embodiment, a conductive structure includes a plurality of conductive steps extending laterally along the conductive structure where each conductive step of the plurality of conductive steps is at least partially separated from an adjacent conductive step of the plurality of conductive steps by insulative material. The conductive structure further includes a contact extending at least partially through at least two conductive steps of the plurality of conductive steps, wherein the contact is in communication with at least one of the conductive steps and insulated from at least another one of the conductive steps.

In a further embodiment, a device includes a plurality of memory cells and a conductive structure. The conductive structure includes a plurality of conductive steps where each conductive step of the plurality of conductive steps is in electrical communication with a respective at least one memory cell of the plurality of memory cells. The conductive structure further includes a plurality of contacts each extending through at least one conductive step of the plurality of conductive steps, each contact of the plurality of contacts being in electrical communication with a respective at least one of the plurality of conductive steps and being insulated from another conductive step of the plurality of conductive steps with insulative material at least partially between the contact and the another conductive step.

In an additional embodiment, a system includes a semiconductor device and a conductive structure in electrical communication with the semiconductor device. The conductive structure includes a stair step structure comprising a plurality of steps each having a lateral end portion laterally offset from a lateral end portion of an adjacent step. Each step comprising conductive material and insulative material at least partially separating a respective step of the plurality of steps from an adjacent step of the plurality of steps. The conductive structure further includes a plurality of contacts, each contact of the plurality of contacts extending through at least one step of the plurality of steps and being in communication with at least one respective step of the plurality of steps.

In another embodiment, a method of forming a conductive structure includes forming a plurality of openings through at least one of a plurality of conductive materials, each conductive material being at least partially separated by a respective insulative material of a plurality of insulative materials, forming a liner in each opening of the plurality of openings, exposing a portion of a respective at least one conductive material of the plurality of conductive materials in each opening of the plurality of openings, and foaming a respective contact in each opening of the plurality of openings in communication with the exposed portion of the respective at least one conductive material of the plurality of conductive materials.

In an additional embodiment, a method of forming electrical connections for a stair step conductive structure includes forming a plurality of steps each having a lateral end portion laterally offset from a lateral end portion of an adjacent step over an interconnect, forming an opening through each step of the plurality of steps extending through the plurality of steps to the interconnect, and forming a contact in the opening in electrical communication with at least one of the plurality of steps and the interconnect.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, combinations, equivalents, and alternatives falling within the scope of the present disclosure as defined by the following appended claims and their legal equivalents.

What is claimed is:

1. A conductive structure, comprising:
   a plurality of conductive steps extending laterally along the conductive structure, each conductive step of the plurality of conductive steps being at least partially separated from an adjacent conductive step of the plurality of conductive steps by insulative material, wherein each conductive step of the plurality of conductive steps comprises a lateral end portion laterally offset from a lateral end portion of an adjacent step;
   a contact extending at least partially through at least two conductive steps of the plurality of conductive steps, wherein the contact extends through the lateral end portion of one conductive step of the at least two conductive steps, and wherein the contact is in communication with the lateral end portion of the one conductive step and insulated from at least another conductive step of the at least two conductive steps; and
   an interconnect in communication with the contact, wherein the conductive structure overlies the interconnect, and wherein the contact extends at least partially through the at least two conductive steps to the interconnect.

2. The conductive structure of claim 1, wherein the contact comprises a first contact of a plurality of contacts, each contact of the plurality of contacts extending through at least one conductive step of the plurality of conductive steps and further comprising a second contact of the plurality of contacts extending at least partially through the at least two conductive steps of the plurality of conductive steps, wherein the second contact is in communication with the at least another conductive step and insulated from the one conductive step, and wherein the second contact extends at least partially through the at least two conductive steps to the interconnect.

3. The conductive structure of claim 2, wherein each contact of the plurality of contacts is in communication with at least a respective one of the conductive steps and insulated from the remaining conductive steps.

4. The conductive structure of claim 3, wherein each contact of the plurality of contacts is in communication with a different conductive step of the plurality of conductive steps.

5. The conductive structure of claim 2, wherein each conductive step of the plurality of conductive steps comprises a contact portion laterally offset from a contact portion of an adjacent conductive step of the plurality of conductive steps.

6. The conductive structure of claim 2, wherein each contact of the plurality of contacts comprises a proximal portion having a first width and a distal portion having a second width greater than the first width.

7. The conductive structure of claim 6, wherein a distal surface of each conductive step of the plurality of conductive steps forms a surface of the conductive step in communication with a respective one of the contacts.

8. A conductive structure, comprising:
   a plurality of conductive steps extending laterally along the conductive structure, each conductive step of the plurality of conductive steps being at least partially separated from an adjacent conductive step of the plurality of conductive steps by insulative material;
   a plurality of contacts, at least one contact of the plurality of contacts extending at least partially through at least two conductive steps of the plurality of conductive steps, wherein the at least one contact is in communication with at least one of the conductive steps and insulated from at least another one of the conductive steps; and
   an interconnect in communication with the at least one contact, wherein the conductive structure overlies the interconnect, and wherein the at least one contact extends at least partially through the at least two conductive steps to the interconnect, and wherein each contact of the plurality of contacts is in communication with the interconnect.

9. The conductive structure of claim 8, wherein each contact of the plurality of contacts is in communication with a respective one of the plurality of conductive steps through which the contact extends positioned furthest from the interconnect.

10. The conductive structure of claim 1, wherein the contact is isolated from the at least another conductive step of the plurality of conductive steps with an insulative material formed between the contact and the at least another conductive step of the plurality of conductive steps.

11. A device, comprising:
    a plurality of memory cells; and
    a conductive structure comprising:
      a plurality of conductive steps, each conductive step of the plurality of conductive steps being in electrical communication with a respective at least one memory cell of the plurality of memory cells;
      a plurality of contacts each extending through at least one conductive step of the plurality of conductive steps, each contact of the plurality of contacts being in electrical communication with a respective at least one of the plurality of conductive steps and being insulated from another conductive step of the plurality of conductive steps with insulative material at least partially between the contact and the another conductive step; and
      an interconnect, the conductive structure at least partially overlying the interconnect and wherein each contact of the plurality of contacts extends from its respective conductive step of the plurality of conductive steps through the conductive structure to the interconnect.

12. The device of claim 11, wherein the plurality of conductive steps comprises a plurality of word line plates.

13. The device of claim 12, wherein each word line plate of the plurality of word line plates comprises a contact portion laterally offset from a contact portion of an adjacent word line plate of the plurality of word line plates, and wherein each contact of the plurality of contacts is in communication with a respective one of the plurality of word line plates and isolated from other word line plates of the plurality of word line plates.

14. A system, comprising:
    a semiconductor device; and a conductive structure in electrical communication with the semiconductor device, the conductive structure comprising:
  a stair step structure comprising:
    a plurality of steps each having a lateral end portion laterally offset from a lateral end portion of an adjacent step, each step comprising conductive material and insulative material at least partially separating a respective step of the plurality of steps from an adjacent step of the plurality of steps; and
    a plurality of contacts, each contact of the plurality of contacts extending through at least one step of the plurality of steps and being in communication with at least one respective step of the plurality of steps; and
  an interconnect in communication with each contact of the plurality of contacts, wherein the stair step structure overlies the interconnect, and wherein each contact of the plurality of contacts extends through each step of the plurality of steps that is positioned between the at least one respective step of the plurality of steps that the contact is in communication with and the interconnect.

15. The system of claim 14, wherein each contact of the plurality of contacts is disposed in a respective opening of a plurality of openings extending at least partially through the conductive structure, and further comprising an insulative liner disposed in at least one opening of the plurality of openings, at least one contact of the plurality of contacts being at least partially disposed within the insulative liner, and wherein the insulative liner at least partially isolates the at least one contact from at least one step of the plurality of steps.

16. The system of claim 15, further comprising a conductive liner disposed in at least one opening of the plurality of openings, the conductive liner being disposed between at least one step of the plurality of steps and at least one contact of the plurality of contacts disposed in the at least one opening of the plurality of openings, and wherein the at least one contact of the plurality of contacts is at least partially disposed within the insulative liner and at least partially within the conductive liner.

17. A method of forming a conductive structure, the method comprising:
  forming a plurality of openings through at least one of a plurality of conductive materials, each conductive material being at least partially separated by a respective insulative material of a plurality of insulative materials;
  extending each of the plurality of openings to an interconnect underlying the plurality of conductive materials and the plurality of insulative materials;
  forming a liner in each opening of the plurality of openings;
  exposing a portion of a respective at least one conductive material of the plurality of conductive materials in each opening of the plurality of openings; and
  forming a respective contact in each opening of the plurality of openings in communication with the exposed portion of the respective at least one conductive material of the plurality of conductive materials.

18. The method of claim 17, wherein forming a plurality of openings comprises forming a plurality of openings wherein each of the openings has a respective portion with a width greater than a width of another portion of the respective opening.

19. The method of claim 17, wherein exposing a portion of a respective at least one conductive material of the plurality of conductive materials in each opening of the plurality of openings comprises removing a portion of the liner to expose a lateral side surface and distal surface of the respective at least one conductive material of the plurality of conductive materials.

20. The method of claim 17, further comprising forming a conductive liner in each opening of the plurality of openings before forming the respective contact in each opening of the plurality of openings.

21. The method of claim 17, wherein forming a plurality of openings through at least one conductive material of a plurality of conductive materials comprises:
  forming a mask including a plurality of apertures over the plurality of conductive materials and the plurality of insulative materials; and
  removing a portion of the plurality of conductive materials and the plurality of insulative materials through the plurality of apertures to form a plurality of contact holes.

22. The method of claim 21, wherein forming a plurality of contact holes comprises:
  removing a portion of the mask at the plurality of apertures to increase a dimension of the plurality of apertures formed in the mask to form a plurality of enlarged apertures in the mask; and
  removing at least one insulative material of the plurality of insulative materials through the plurality of enlarged apertures.

23. The method of claim 17, wherein forming a plurality of openings through at least one conductive material of a plurality of conductive materials comprises:
  forming a mask including a plurality of apertures over the plurality of conductive materials and the plurality of insulative materials;
  removing at least one insulative material of the plurality of insulative materials through the plurality of apertures to form an enlarged distal portion of the plurality of openings;
  forming a material at least partially within the enlarged distal portion of each of the plurality of openings to form a plurality of narrowed apertures in the mask having a width less than a width of the plurality of apertures; and
  removing the plurality of conductive materials and the plurality of insulative materials through the plurality of narrowed apertures formed in the mask.

24. The method of claim 17, further comprising forming the plurality of conductive materials to each have the same material composition.

25. The method of claim 17, further comprising forming the plurality of insulative materials to each have the same material composition.

26. A method of forming electrical connections for a stair step conductive structure, the method comprising:
  forming a plurality of steps each having a lateral end portion laterally offset from a lateral end portion of an adjacent step over an interconnect;
  forming an opening through the lateral end portion of one step of the plurality of steps and through each step of the plurality of steps underlying the lateral end portion of the one step such that the opening extends through the lateral end portion of the one step and each of the plurality of steps underlying the lateral end portion of the one step to the interconnect; and
  forming a contact in the opening in electrical communication with at least one of the plurality of steps and the interconnect.

27. The method of claim 26, wherein forming an opening comprises forming a contact hole to extend through a plurality of conductive materials each separated by an insulative material and further comprising forming an insulating material in the contact hole to insulate the contact from at least one of the plurality of conductive materials through which the contact hole extends.

* * * * *